(12) United States Patent
Ni

(10) Patent No.: US 6,228,729 B1
(45) Date of Patent: May 8, 2001

(54) MOS TRANSISTORS HAVING RAISED SOURCE AND DRAIN AND INTERCONNECTS

(75) Inventor: Cheng-Tsung Ni, Hsinchu (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 09/514,455

(22) Filed: Feb. 25, 2000

(30) Foreign Application Priority Data

Mar. 26, 1999 (KR) .............................................. 088104775

(51) Int. Cl.⁷ ................................................. H01L 21/336
(52) U.S. Cl. .......................... 438/300; 438/301; 438/305; 438/230
(58) Field of Search .................................... 438/300, 299, 438/301, 303, 305–307, 229–232

(56) References Cited

U.S. PATENT DOCUMENTS

| | | | | |
|---|---|---|---|---|
| 5,776,787 | * | 7/1998 | keshtbod | 438/257 |
| 5,966,597 | * | 10/1999 | wright | 438/197 |
| 6,083,827 | * | 7/2000 | lin et al. | 438/631 |

* cited by examiner

Primary Examiner—Chandra Chaudhari
Assistant Examiner—Thanh Nguyen
(74) Attorney, Agent, or Firm—Heller Ehrman White & McAuliffe LLP

(57) ABSTRACT

A process for fabricating a semiconductor device comprising a gate electrode, a raised source, a raised drain and an interconnect inlaid into an isolation region. A semiconductor device is fabricated by a process comprising the following steps: forming sequentially a first dielectric layer and a first conductor layer on the substrate; forming one or more inset isolation regions in the substrate; filling each inset isolation region with an isolation layer; forming a second dielectric layer on top of the first conductor layer and the isolation layers; forming simultaneously a first and a second trench; forming a plurality of cavities at the bottom of the first trench; filling each cavity with a second conductor layer; forming a plurality of dielectric sidewalls and a dielectric bottom layer in the first trench; forming the gate electrode and the interconnect by filling the first and second trenches with a third conductor layer; doping the first conductor layer with dopants; and forming the raised source and the raised drain by driving the dopants into the surface region of the substrate.

20 Claims, 3 Drawing Sheets

MOS TRANSISTORS HAVING RAISED SOURCE AND DRAIN AND INTERCONNECTS

BACKGROUND OF THE INVENTION

1. Field of the Invention

This invention relates generally to processes for fabricating semiconductor transistors, and in particular to a new process for simultaneously forming raised sources and drains and interconnects for metal oxide semiconductor transistors.

2. Description of the Prior Art

Semiconductor devices are constantly being miniaturized. As the overall dimensions of semiconductor devices are made smaller and smaller, hundreds of thousands of integrated circuit (IC) components including metal oxide semiconductor field-effect transistors (MOSFETs) and other metal-oxide-semiconductor (MOS) and complementary metal-oxide-semiconductor (CMOS) components have to be packed into a single IC chip. Thus, it is not an overstatement that the semiconductor industry is constantly under pressure to improve device structure and processing methods so that new IC chips can meet ever-tightening functional requirements, e.g., compact size, high-speed operation, low operating voltage, and low power consumption.

The fabrication of field-effect transistors involves the formation of n-type and p-type doped regions. As the IC device components become smaller and smaller, the formation of very shallowly doped regions, i.e., "shallow junctions," becomes a major limiting factor in the fabrication of semiconductor devices having metal oxide semiconductor field-effect transistors (MOSFETs) and complementary metal oxide semiconductor (CMOS) components. Shallow junctions, when properly formed, can mitigate various undesirable effects caused by short channels, leakage current, contact resistance and sheet resistance.

Technical difficulties have plagued the formation of shallow junctions. For example, in the case of p junctions, the typical dopant is boron, which has a low atomic number (Z) of 5. On the one hand, during a conventional ion implantation process, low-Z dopant ions tend to channel through the crystalline structure of the semiconductor substrate and form an undesirable implantation profile with a deep tail, where the concentration and depth of the dopant ions easily extend beyond the desirable channel depth. On the other hand, low-energy ion implantation techniques (with energy less than 5 KeV) pose a separate set of problems: the size and direction of low-energy ion beams are difficult to control; low-energy ions tend to sputter, deposit or diffuse randomly instead of penetrating the substrate surface region; low-energy ion implanters are both difficult and expensive to make; and so on.

The use of raised source and drain has recently been proposed as an alternative way for forming a shallow junction in a semiconductor transistor. Thus, landing pads are first formed at the surface regions of the substrate where the source and the drain are to be formed; meanwhile, a resist mask protects the active region where the gate electrode is to be formed. Dopant ions are then implanted in the pads through a conventional ion implantation process. The implanted dopant ions are made to diffuse, typically by way of thermal treatment, into the designated substrate surface regions to form the raised source and drain. Subsequently, the protective resist mask is removed, and the gate electrode is formed at the active region. Various other elements of the semiconductor devices, such as the conductors and the dielectric layers, are sequentially formed on the substrate to complete the fabrication of the semiconductor transistor. Finally, interconnects are formed to link up the transistors and other IC components of the semiconductor device.

Although the inclusion of raised source and drain has made it possible to fabricate semiconductor transistors with shallow junctions, the constant miniaturization of semiconductor devices dictates that other improvements be made to both device structures and fabrication techniques relating to the formation of raised source and drain. First, as the lithographic line width is reduced to 0.25 $\mu$m or smaller (i.e., deep submicron), it becomes more and more difficult to control the critical dimensions of the semiconductor devices through conventional exposure and etching schemes. Second, device miniaturization places great strain on device planarization requirements, particularly when such devices include raised sources and drains. Last but not the least, device miniaturization makes it increasingly difficult to avoid various problems associated with conventional interconnect-formation techniques, which typically form interconnect on top of the isolation regions of the IC device. Such interconnect problems include poor adhesion between interconnect and isolation layer and elevated interconnect resistance. In short, the mere use of raised source and drain taught in the conventional art is insufficient to cope with all the problems associated with the fabrication of ever-shrinking semiconductor devices. Accordingly, there is plenty of room for improvement in the fabrication of metal oxide semiconductor devices having raised source and drain electrodes.

SUMMARY OF THE INVENTION

Accordingly, it is an object of the present invention to provide a MOS transistor processing method that facilitates the formation of raised source and drain electrodes to overcome shallow-junction-related problems.

Another object of the present invention is to form simultaneously the raised sources and drains and interconnects for MOS transistors to overcome processing problems associated with deep submicron semiconductor devices.

Yet another object of the present invention is to provide a method for forming MOS transistor interconnects that are less susceptible to adhesion and contact resistance problems encountered in conventional art.

In accordance with the objects described above, the present invention provides a method of fabricating a MOS transistor having a gate electrode, a raised source electrode, a raised drain electrode and an interconnect, which method include the following processing steps:

Forming sequentially on a substrate a first dielectric layer and a first conductor layer;

defining an active region on the substrate by using a first patterned resist layer;

forming one or more inset isolation regions in the substrate by removing those portions of the first conductor layer, the first dielectric layers and the substrate underlying such layers that are located outside the active region;

filling each of the isolation regions with an isolation layer;

forming a lightly doped well in the substrate;

forming a second dielectric layer on top of the first conductor layer and the isolation layers;

defining a location for the gate electrode and a location for the interconnect by using a second patterned resist layer;

forming simultaneously a first trench at the location for the gate electrode by removing portions of the second dielectric layer, the first conductor layer, the first dielectric layer and the substrate underlying such layers and a second trench at the location for the interconnect by removing portions of the isolation layer;

forming cavities at the bottom of the first trench by laterally removing portions of the first dielectric layer;

filling each such cavity with a second conductor layer;

forming dielectric sidewalls and a dielectric bottom layer in the first trench;

forming the gate electrode and the interconnect by filling the first trench and the second trench with a third conductor layer;

doping the first conductor layers with dopants; and forming the raised source electrode and the raised drain electrode by thermally driving the dopants into the surface regions of the well.

Essentially, the MOS fabrication process disclosed herein has the following significant advantages over those taught in the conventional art:

An advantage of the present invention is that processing problems typically associated with gate formation in the presence of rather delicate source and drain regions are circumvented because the gate electrode of the present invention is formed before the source and drain electrodes;

Another advantage of the present invention is that it is more compatible with deep submicron semiconductor processes because the definition of the raised source and drain in the present invention does not depend upon a single high-resolution lithographic step.

Still another advantage of the present invention is that it provides a simplified interconnect formation process which greatly reduces device planarization difficulties.

These and other objects, features and advantages of the present invention will no doubt become apparent to those skilled in the art after reading the following detailed description of the preferred embodiment that is illustrated in the several figures of the drawing.

IN THE DRAWINGS

DETAILED DESCRIPTION OF THE PREFERRED EMBODIMENTS

While the present invention may be embodied in many forms, details of a preferred embodiment are schematically shown in FIGS. 1 through 6, with the understanding that the present disclosure is not intended to limit the invention to the embodiment illustrated.

The MOS transistor fabrication method disclosed herein differs from those taught in the conventional art in at least two critical aspects: (A) the gate electrode and interconnect of the MOS transistor of the present invention are formed before the source and drain electrodes, thus circumventing those processing problems typically associated with gate formation in the presence of rather delicate source and drain regions; and (B) the interconnects of the MOS transistors of the present invention are inlaid into the insulation layers, thus greatly simplifying the interconnect formation process and reducing difficulties in device planarization.

Figure 1:
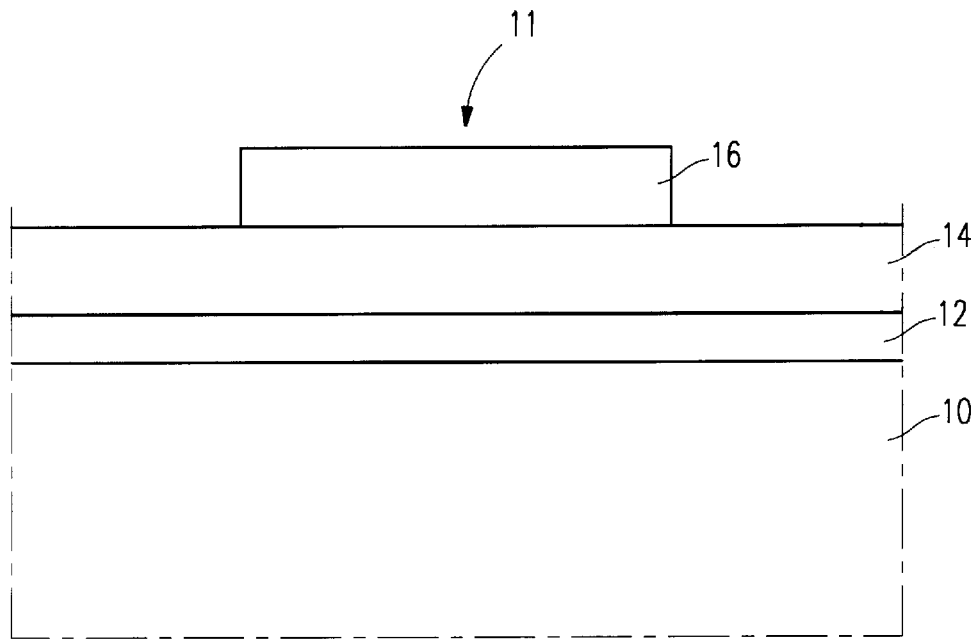
FIG. 1 is a schematic, cross-sectional representation of the MOS transistor of the present invention after the formation of the first dielectric layer, the first conductor layer and the first patterned resist layer.

In accordance with a specific embodiment of the present invention, a first dielectric layer 12 is first formed on top of a semiconductor (e.g., Si) substrate 10; see FIG. 1. A first conductor layer 14 is then formed on top of the first dielectric layer 12. Preferably, the first conductor layer 14 is a polysilicon (poly-Si) layer, and is approximately 200 nm or less in thickness. A first resist (e.g., photoresist) layer 16 is then deposited and patterned on top of the first conductor layer 14. This first patterned resist layer 16 will help define the active region 11 on the substrate 10 where the MOS transistor will be formed.

Figure 2:
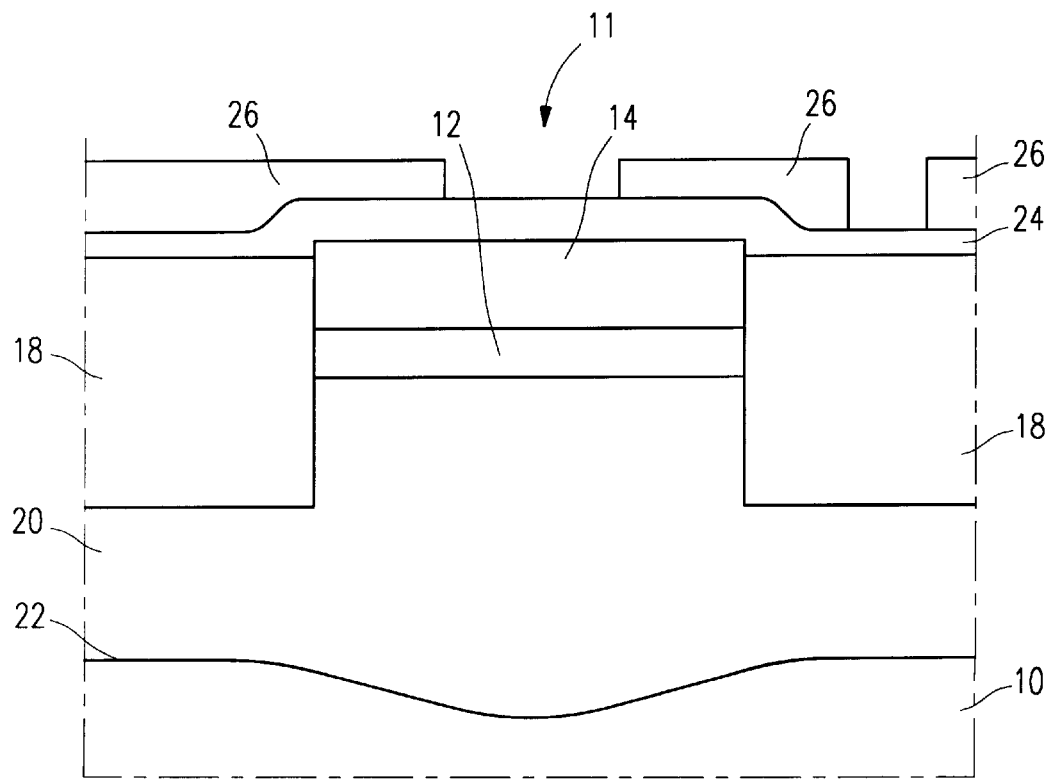
FIG. 2 is a schematic, cross-sectional representation of the MOS transistor of the present invention after the formation of isolation layers and the second patterned resist layer.

As shown in FIG. 2, an anisotropic etching step is conducted to remove not only those portions of the first conductor 14 and the first dielectric layer 12 that are not masked by the patterned resist layer 16, but also portions of the substrate 10 that have been directly beneath the removed portions of the first dielectric layer 12. Typically, approximately 300 nm think of the substrate 10 is removed by this anisotropic etching step, resulting in the formation of inset regions or shallow trenches outside of the active region 11. The resist layer 16 is then removed.

Also shown in FIG. 2, isolation layers 18 is formed by first filling the aforementioned shallow trenches with a dielectric material (e.g., silicon dioxide) and then planarizing the top surface of the as-deposited dielectric material by, e.g., chemical-mechanical polishing (CMP).

After the isolation layers 18 are formed, dopants are typically implanted into the substrate 10 to form a lightly doped well region 20. The types and concentrations of the dopants depend upon the type of the well (p or n) and the desirable level of electron carriers in the well. Because these dopants penetrate deeper in the active regions 11 than in the isolation layers 18, the well region 22 shown in FIG. 2 has a profile 22 that is convex under the active region 11 toward the bottom of the substrate.

Next, referring again to FIG. 2, a second dielectric layer 24 is formed on top of the isolation layers 18 and the first conductor layer 14. This second dielectric layer 24 will serve as an etch-stop and a protective layer in subsequent processing steps. A second resist (e.g., photoresist) layer 26 is then deposited and patterned on top of the second dielectric layer 24. This second patterned resist layer 26 will help define the location of the gate electrode and the location of the interconnect in the isolation layer 18, as described below.

Figure 3:
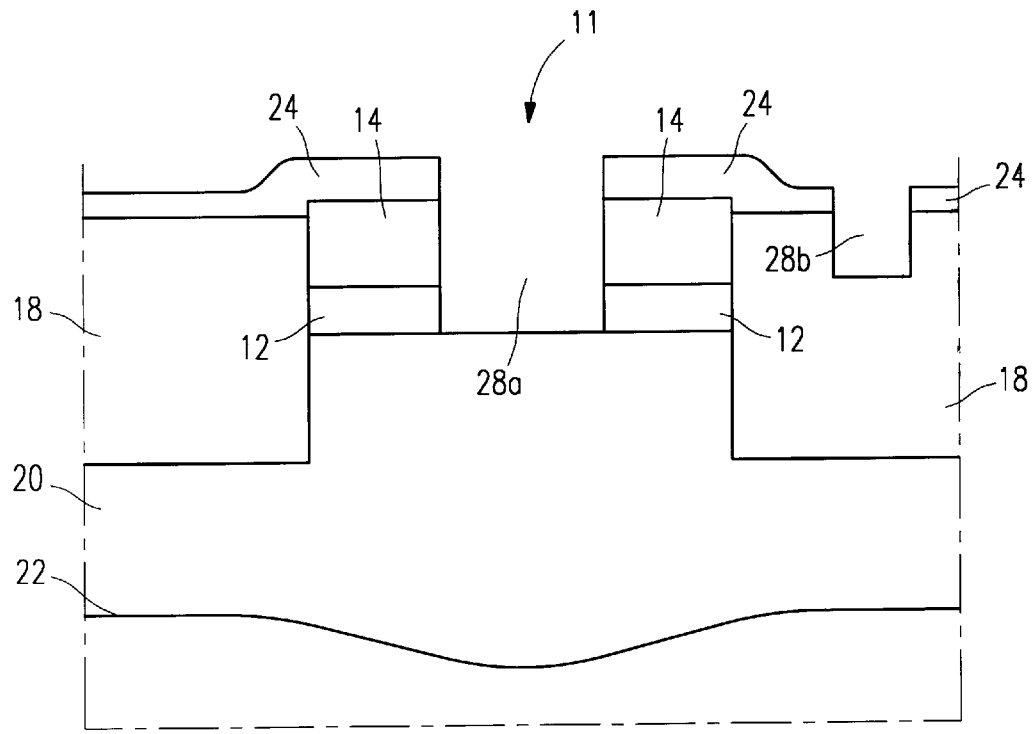
FIG. 3 is a schematic, cross-sectional representation of the MOS transistor of the present invention after the formation of two trenches, one at the active region and the other within the isolation layer.

As shown in FIG. 3, using the second patterned resist layer 26 as an etching mask, another anisotropic etching step is conducted to remove portions of the second dielectric layer 24, the first conductor layer 14 and the first dielectric layer 12, as well as approximately 100–200 nm thick of the isolation layer 18 at a pre-selected location earmarked for interconnect formation. As a result of this second anisotropic etching step, two trenches 28a and 28b, the former in the active region 11 and the latter in the isolation layer 18, are formed.

Figure 4:
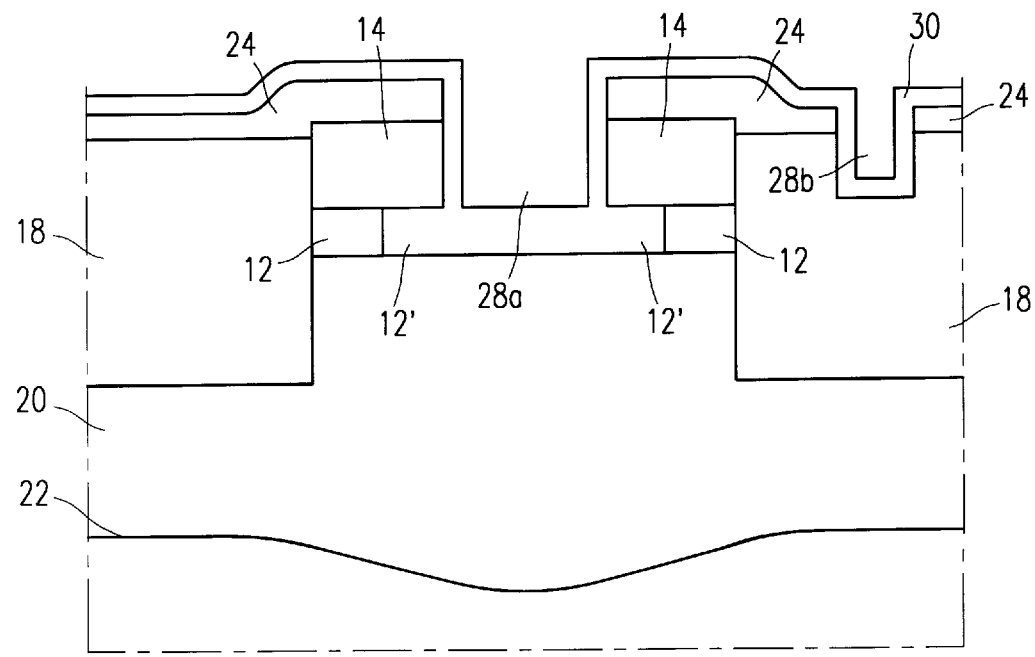
FIG. 4 is a schematic, cross-sectional representation of the MOS transistor of the present invention after the formation of the second conductor layer and the filling of the bottom of the active-region trench.

Referring to FIG. 4, an isotropic etching step using, e.g., hydrofluoric acid as the etchant, is then conducted to remove laterally more dielectric material from the first dielectric layer 12 at the bottom of the trench 28a, resulting in the formation of cavities 12' located under the first conductor layers 14. Typically, these cavities 12' are approximately 10–20 nm thick deep as measured from the edge of the first conductor layer 14. The concentration of the hydrofluoric acid can be varied to gain better control of the extent of the etching and the depth of the cavities.

A second conductor layer 30 is then formed in both trenches 28a and 28b. This second conductor layer 30 also fills up the cavities at the bottom of the trench 28a. Typical materials for this second conductor layer 30 include chemical-vapor-deposited (CVD) poly-Si, CVD metals, metal silicides, CVD epitaxial-silicon (epi-Si), selective-growth epi-Si and selective-growth tungsten. Note that this second conductor layer 30 provides connection between the first conductor layers 14 and the substrate 10 and will, as shown below, provide connection between the first conductor layers 14 and the source and drain electrodes of the MOS transistor.

Figure 5:
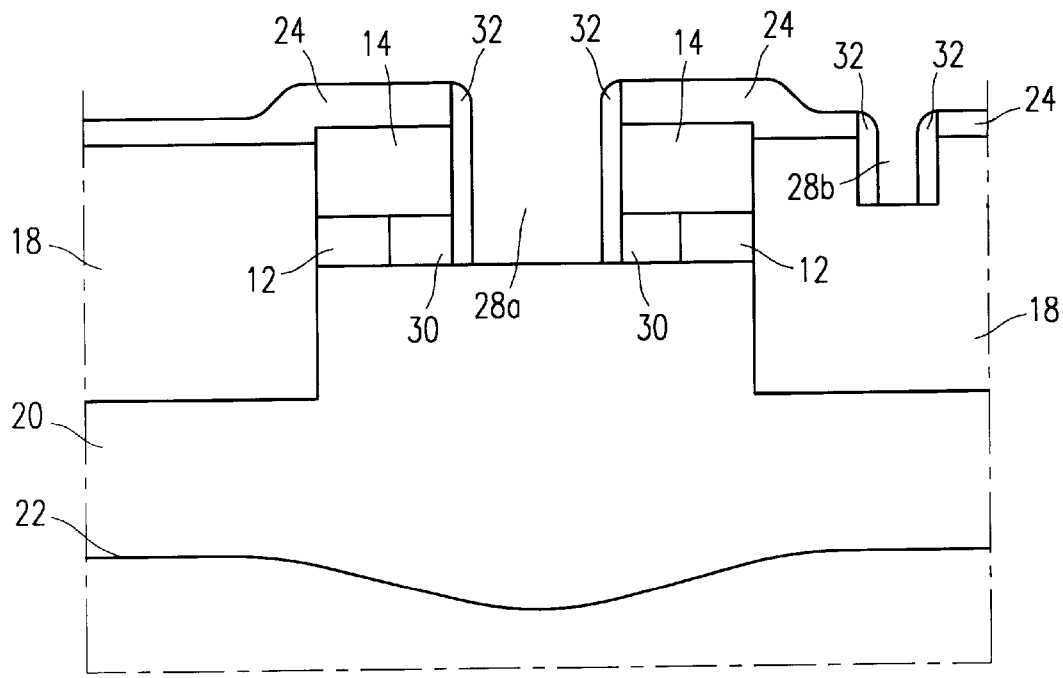
FIG. 5 is a schematic, cross-sectional representation of the MOS transistor of the present invention after the formation of sidewalls in the trenches.

Next, referring to FIG. 5, an isotropic etching step is conducted to remove the second conductor layer 30 except those portions filling the two cavities 12' (shown in FIG. 4). A third dielectric layer 32 is then formed as sidewalls inside the two trenches 28a and 28b. As is known to those skilled in the art, the formation of sidewalls typically involves the deposition of a dielectric layer. (e.g., a CVD oxide or nitride layer) and the etch-back of the as-deposited dielectric layer. These sidewalls are used to isolate the gate electrode from the source and drain electrode.

Figure 6:
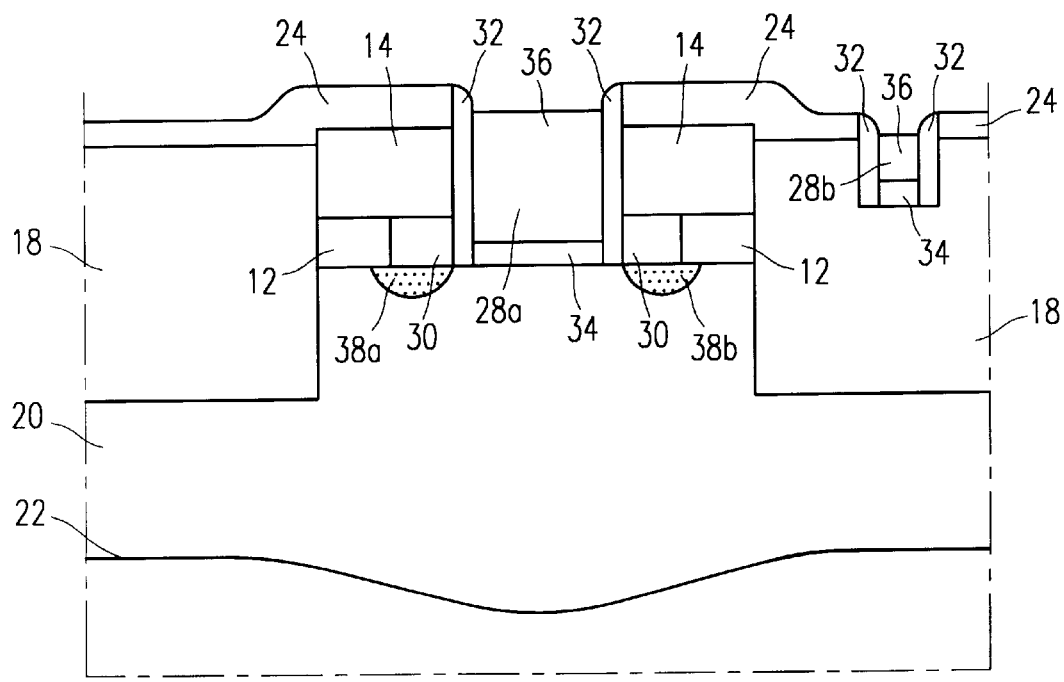
FIG. 6 is a schematic, cross-sectional representation of the MOS transistor of the present invention after the formation of the raised source, drain and interconnect.

Next, referring to FIG. 6, a fourth dielectric layer 34 is formed at the bottom of the trenches 28a. This fourth dielectric layer 34 is formed as the gate dielectric of the MOS transistor. Numerous materials, such as oxide, CVD nitride, silicon oxynitride and tantalum pentoxide, can be used as the material for the fourth dielectric layer 34.

Notably, it is not essential to form the third and fourth dielectric layers 32, 34 in the trenches 28b located in the isolation layer 18. In contrast, the third and fourth dielectric layers 32, 34 in the active-region trench 28a are essential for the MOS transistor, because the former will serve as the insulation between the gate electrode and the first conductor layers 14, while the latter will serve as the gate dielectric between the gate electrode and the substrate.

Next, a conductor layer is formed on top of the entire structure on the substrate and fills up the two trenches 28a and 28b. Preferably, this third conductor layer 36 is made of metal, poly-Si, metal silicide or metal nitride. The as-deposited conductor layer is then treated by back-etching, CMP and/or other techniques known to those in the art to remove all the conductor material except that which fills the two trenches 28a and 28b, as well as to planarize the top surface of the substrate structure; see FIG. 6. On the one hand, the third conductor layer 36 in the active-region trench 28a, together with the underlying fourth conductor layer 34 and the surface region of the substrate 10, forms the gate electrode structure of the MOS transistor. On the other hand, the third conductor 36 inlaid in the isolation-layer trench 28b becomes the interconnect for the MOS transistor.

Note that the aforesaid gate electrode structure is not formed by a single lithographic step and, as a result, is not as susceptible to line width limitations as the conventional art of gate electrode formation. Therefore, the method of forming the MOS transistor of the present invention is more suitable for deep submicron device fabrication. Note also that the interconnect inlaid into the isolation layer of the present invention, visa-vis the interconnect formed on top of the isolation layer in the conventional art, results in significantly fewer adhesion and contact resistance problems.

Finally, dopant impurities requisite for the formation of the source and drain of the transistor are implanted into the first conductor layers 14. Depending on the type of the MOS elements being fabricated (i.e., NMOS vs. PMOS), a mask (e.g., photoresist) is used to cover either the PMOS portions of the substrate when N+ ions are implanted to form NMOS elements, or the NMOS portions of the substrate when P+ ions are implanted to form PMOS elements. This ion implantation step is followed by an annealing process, which makes the impurities diffuse into those areas of the well region 20 under the second conductor layers 30, thus forming the raised source 38a and the raised drain 38b of the MOS transistor of the present invention. Note that no additional landing pads are required, and that the raised source 38a and drain 38b are connected to the first conductor layers 14 via the second conductor layers 30. The above annealing process may be conducted in a conventional furnace at approximately 850° C. for 5 to 30 minutes. Alternatively, to avoid undesirable side effects caused by prolonged annealing (e.g., phase change in the conductor material), rapid thermal processing (RTP) may be utilized. Preferably, such annealing by RTP is conducted at approximately 1000° C. for approximately 10–30 seconds.

While the invention has been particularly shown and described with reference to the above preferred embodiment, it will be understood by those skilled in the art that many other modifications and variations may be made thereto without departing from the broader spirit and scope of the invention as set forth in the claims. The specification and drawings are accordingly to be regarded as an illustrative, rather than restrictive.

What is claimed is:

1. A process of fabricating on a substrate a semiconductor device having a gate electrode, a raised source, a raised drain and an interconnect, comprising the steps of:

forming sequentially a first dielectric layer and a first conductor layer on said substrate;

forming one or more inset isolation regions in said substrate by removing portions of said first conductor layer, said first dielectric layer and said substrate underlying said first dielectric layer;

filling each said inset isolation region with an isolation layer;

forming a second dielectric layer on top of said first conductor layer and said isolation layers;

simultaneously forming a first trench by removing a portion of each of said second dielectric layer, said first conductor layer, said first dielectric layer and said substrate underlying said first dielectric layer and forming a second trench by removing a portion of said isolation layer;

forming a plurality of cavities at the bottom of said first trench by laterally removing portions of said first dielectric layer;

filling each said cavity with a second conductor layer;

forming a plurality of dielectric sidewalls and a dielectric bottom layer in said first trench;

forming said gate electrode and said interconnect by filling said first trench and said second trench with a third conductor layer;

doping said first conductor layer with dopants; and forming said raised source and said raised drain by driving said dopants into said substrate.

2. The process of claim 1, further comprising the step of forming a lightly doped well in said substrate between said step of filling the inset isolation regions and said step of forming the second dielectric layer.

3. The process of claim 2, wherein said isolation layers are silicon dioxide layers.

4. The process of claim 3, wherein said step of filling said inset isolation region comprises two consecutive steps of:

depositing said isolation layer on said substrate; and removing said isolation layer other than the portions filling said inset isolation region.

5. The process of claim 2, wherein said step of forming said inset isolation regions is carried out by anisotropic etching.

6. The process of claim 5, wherein said step of forming said first trench and said second trench is carried out by anisotropic etching.

7. The process of claim 6, wherein said step of forming said cavities in said first trench is carried out by isotropic etching.

8. The process of claim 7, wherein said step of filling said cavities comprises two consecutive steps of:

depositing said second conductor layer on said substrate; and removing said second conductor layer other than the portions filling said cavities.

9. The process of claim 8, wherein the material for said second conductor layer is selected from the group consisting of CVD poly-Si, CVD metals, metal silicides, CVD epi-Si, selective-growth epi-Si and selective-growth W.

10. The process of claim 8, wherein said step of forming said raised source and said raised drain is carried out by annealing.

11. A semiconductor device having a gate electrode, a raised source, a raised drain and an interconnect, fabricated on a substrate by a process comprising the steps of:

forming sequentially a first dielectric layer and a first conductor layer on said substrate;

forming one or more inset isolation regions in said substrate by removing portions of said first conductor layer, said first dielectric layer and said substrate underlying said first dielectric layer;

filling each said inset isolation region with an isolation layer;

forming a second dielectric layer on top of said first conductor layer and said isolation layers;

simultaneously forming a first trench by removing a portion of each of said second dielectric layer, said first conductor layer, said first dielectric layer and said substrate underlying said first dielectric layer and forming a second trench by removing a portion of said isolation layer;

forming a plurality of cavities at the bottom of said first trench by laterally removing portions of said first dielectric layer;

filling each said cavity with a second conductor layer;

forming a plurality of dielectric sidewalls and a dielectric bottom layer in said first trench;

forming said gate electrode and said interconnect by filling said first trench and said second trench with a third conductor layer;

doping said first conductor layer with dopants; and forming said raised source and said raised drain by driving said dopants into the surface region of said substrate.

12. The semiconductor device of claim 11, wherein said process further comprises the step of forming a lightly doped well in said substrate between said step of filling the inset isolation regions and said step of forming the second dielectric layer.

13. The semiconductor device of claim 12, wherein said step of filling said inset isolation region comprises two consecutive steps of:

depositing said isolation layer on said substrate; and removing said isolation layer other than the portions filling said inset isolation region.

14. The semiconductor device of claim 13, wherein said step of forming said inset isolation regions is carried out by anisotropic etching.

15. The semiconductor device of claim 14, wherein said step of forming said first trench and said second trench is carried out by anisotropic etching.

16. The semiconductor device of claim 15, wherein said step of forming said cavities in said first trench is carried out by isotropic etching.

17. The semiconductor device of claim 16, wherein said step of filling said cavities comprises two consecutive steps of:

depositing said second conductor layer on said substrate; and removing said second conductor layer other than the portions filling said cavities.

18. The semiconductor device of claim 17, wherein said step of forming said raised source and said raised drain is carried out by annealing.

19. The semiconductor device of claim 11, wherein said semiconductor device is a MOS transistor.

20. The semiconductor device of claim 19, wherein said semiconductor device is a MOSFET.

* * * * *

UNITED STATES PATENT AND TRADEMARK OFFICE
CERTIFICATE OF CORRECTION

| | |
|---|---|
| PATENT NO. | : 6,228,729 B1 |
| DATED | : May 8, 2001 |
| INVENTOR(S) | : Ni |

Page 1 of 1

It is certified that error appears in the above-identified patent and that said Letters Patent is hereby corrected as shown below:

<u>Title page,</u>
-- Item [30]    Foreign Application Priority Data
02-26-1999......TW...........088102903 --

Signed and Sealed this

Thirtieth Day of April, 2002

Attest:

Attesting Officer

JAMES E. ROGAN
*Director of the United States Patent and Trademark Office*